United States Patent [19]

Balter

[11] Patent Number: 4,893,980

[45] Date of Patent: Jan. 16, 1990

[54] DEVICE FOR MOVING OBJECTS WITHIN A SEALED CHAMBER

[75] Inventor: Valentin Balter, Cupertino, Calif.

[73] Assignee: Huntington Mechanical Laboratories, Inc., Mountain View, Calif.

[21] Appl. No.: 286,602

[22] Filed: Dec. 19, 1988

[51] Int. Cl.[4] .............................................. B25J 1/00
[52] U.S. Cl. ........................................ 414/3; 901/19; 74/110; 414/751
[58] Field of Search ................... 414/217, 3, 749, 750, 414/751; 901/19, 23, 26; 403/DIG. 1; 74/110; 294/86.41; 269/55, 61; 254/134.3 FT

[56] References Cited

U.S. PATENT DOCUMENTS

| | | | |
|---|---|---|---|
| 2,973,107 | 2/1961 | Cherel | 414/3 |
| 2,996,330 | 8/1961 | Hutto | 414/751 X |
| 3,101,850 | 8/1963 | Quinche | 414/751 |
| 4,118,943 | 10/1978 | Chellis | 74/110 X |
| 4,768,911 | 9/1988 | Balter | 414/3 |

*Primary Examiner*—Robert J. Spar
*Assistant Examiner*—James R. Bidwell
*Attorney, Agent, or Firm*—David Pressman

[57] ABSTRACT

A sample transfer device (110) for manipulating a sample in a sealed vacuum chamber comprises a tubular housing (112) made from magnetically permeable material. The housing has one end (114) closed and another attached to the vacuum chamber. Located inside the housing is a shaft (116) which is connected to a sample holder. One end of this shaft is connected to a hollow body (140) which is made from a magnetically-permeable and air-tight material. This hollow body (140) forms a sealed cavity which contains an inner permanent magnet (142). The magnet (142) is held in place by two cup-shaped members (152 and 154) and two aluminum blocks (156 and 158). The inner magnet (142) interacts with an outer permanent magnet (166) which slides over the surface of cylindrical housing (112) and moves, through magnetic force, the inner magnet and hence the shaft (116) and the sample holder with the sample in the axial direction of the housing, i.e., into a required position in the vacuum chamber. The sealed hollow body prevents the inner magnet (142), which is made from a porous samarium-cobalt alloy, from exposure to vacuum. As a result, the porous material of the magnet is protected from accumulation of impurities detrimental to characteristics of semiconductor devices treated in the vacuum chamber.

20 Claims, 2 Drawing Sheets

DEVICE FOR MOVING OBJECTS WITHIN A SEALED CHAMBER

BACKGROUND—FIELD OF THE INVENTION

The present invention relates to a device for moving or transferring objects within a chamber or between sealed chambers, specifically to such a device which uses an external magnet for controlling movements of an internal magnet which is located in a sealed chamber and is connected to an object to be manipulated.

CROSS REFERENCE TO RELATED CASE

The device of the present invention is an improvement over the device disclosed in my U.S. Pat. No. 4,768,911, granted Sept. 6, 1988.

FIG. 1—BACKGROUND—DESCRIPTION OF PRIOR ART

It is often desirable or necessary to move objects within a closed chamber, such as a vacuum chamber, a high pressure chamber, a high-temperature chamber, or a chamber closed because of hazardous conditions. Such movement usually is done by a shaft which extends through a sealing device into the chamber so that translatory and rotary motions can be imparted into the chamber via the shaft from outside the chamber. The chamber must remain sealed at all times so as to avoid contamination of the sample and the need to re-evacuate or re-prepare the chamber.

One such mechanism is described in my above-mentioned U.S. patent and is shown in FIG. 1. It comprises a sample transfer device 10 for manipulating a sample S in a pair of sealed vacuum chambers (only one of which, i.e., chamber 18, is shown in FIG. 1). The mechanism has a tubular housing 12 made from a magnetically permeable material. The housing has one closed end 14 and another flanged open end 16 for attachment to the vacuum chamber. Located inside the housing is shaft 40 of a square cross section. One end of the shaft is rotatingly connected to an inner permanent magnet 66 which can rotate with respect to the shaft but can move axially therewith. The other end of the shaft protrudes from the housing into the vacuum chamber. The shaft is supported inside the housing by a bevel gear 32 which rotates in a bearing 20 in the housing. Bevel gear 32 has a square opening which guides the shaft during its axial movements. Gear 32 engages another gear 98 which is attached to an output shaft of a rotary drive unit 80 having its drive element outside the housing. The device can transfer a sample from one chamber to another and can position the sample in either chamber in any desired axial or angular orientation for treatment or measurement. In FIG. 1 sample S is shown as a silicon substrate which can be subjected to ion implantation in one chamber and to formation of a pattern by a CVD (chemical vapor deposition) process in another chamber (not shown). In such a mechanism, inner magnet 66, as well as another magnet 70 which slides on cylindrical housing 12, are usually made from a rare-earth sintered alloy, e.g., samarium cobalt alloy. The outer diameter of inner magnet 66 is smaller than the inner diameter of tubular housing 12 to provide a gap 68, preferably of about 1 mm. This gap is necessary to allow magnet 66 to slide freely within the housing. In other words, the outer surface of inner magnet 66 is exposed to a vacuum or a gaseous atmosphere within the sealed chamber.

However, the experience showed that although such a mechanism works reliably and efficiently in chambers having high-temperature or high-pressure conditions, its use in vacuum chambers or chambers containing hazardous substances involves a number of problems which are described below.

Since the samarium cobalt alloy is prepared by powder metallurgy, the material of the inner magnet has a porous structure. Thus when this magnet is exposed to chemicals, its pores absorb such chemicals and then release them during subsequent operations. If the sample transfer device of the type under consideration is used in a vacuum chamber, e.g., for treating a silicon substrate and formation of a pattern thereon by the CVD process, the porous magnet may absorb impurities which will adversely affect the characteristics of semiconductor devices treated in this sealed chamber during subsequent operations. Another disadvantage of the exposed inner magnet is that its porosity prevents rapid evacuation of air from the chamber, since it is necessary to evacuate air not only from the chamber, but also from the pores of the magnet.

Since inner magnet 66 forms gap 68 with the inner walls of housing 12, it will be attracted by the force of outer magnet 70 to one side of the inner wall of housing 12. Thus in the course of its motion, magnet 66 will cause metal-to-metal sliding contact which will damage the inner walls of the housing as well as the surface of the magnet itself.

OBJECTS AND ADVANTAGES OF THE INVENTION

Therefore one object of the invention is to provide a sample transfer device with a magnetically driven sample holding element which can be efficiently used within a sealed chamber in a vacuum or in a hazardous atmosphere. Another object is to provide such a system wherein the problems of using a magnet with porous surfaces in a vacuum or a hazardous atmosphere are obviated, especially the problems of accumulation of foreign substances within the pores and rapid evacuation of air from the sealed chamber. Another object is to provide such a system which reliably supports the magnet within the housing of the device without any danger of damaging the inner walls of the housing. Further objects and advantages will become apparent from the accompanying drawings and description.

DRAWINGS

REFERENCE NUMERALS USED IN THE DRAWINGS

Figure 1:
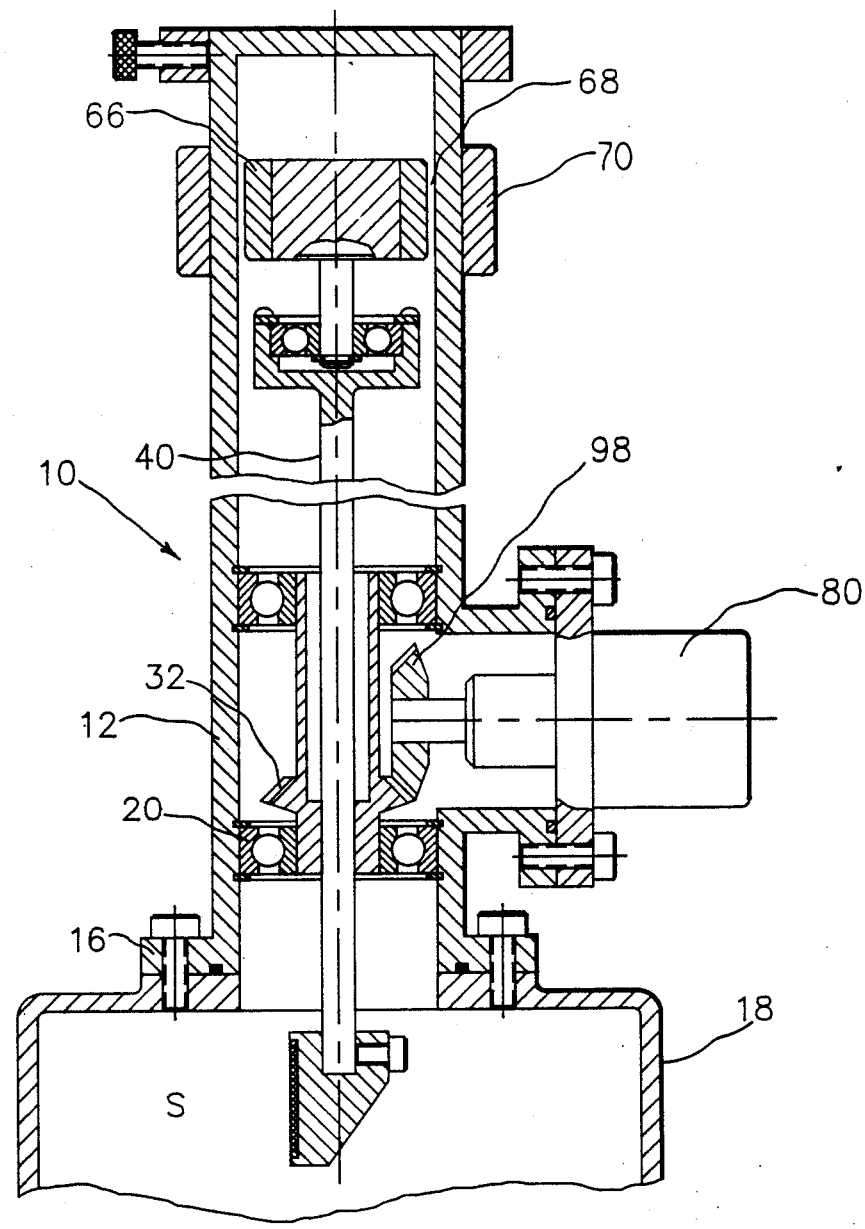
FIG. 1 is a longitudinal sectional view of a known sample transfer device in a position attached to a sealed chamber.

10—sample transfer device
12—tubular housing
14—rear end or bottom
16—flanged end
18—vacuum chamber
32—bevel gear
40—shaft
66—inner magnet
68—gap
70—outer magnet 80—drive unit
98—bevel gear
110—sample transfer device
112—cylindrical housing
114—closed or rear end
116—shaft
118—rear end of shaft
120—bearing holder
122—recess
124—ball bearing
126—outer race
128—inner race
130—balls
132—drive shaft
134—stop ring
136—stop ring
138—screw
140—hollow cylindrical casing
142—inner magnet
144, 146—slide rings
148, 150—annular grooves
152, 154—cup-shaped elements
156, 158—aluminum blocks
160—central portion
162, 164—weld seams
166—outer magnet
168—adjustable stop
170—bolt

FIG. 2—CONSTRUCTION OF A SAMPLE TRANSFER DEVICE WITH A CLOSED INNER MAGNET

A sample transfer device 110 of the invention has a tubular cylindrical housing 112 made of a magnetically-permeable material, such as stainless steel. The right side of housing 112 is closed by an end 114 (hereinafter termed a bottom). The opposite side (not shown in FIG. 2) may be identical to the device shown in FIG. 1. In other words, it may be open and attached to a sealed chamber, such as an ion-beam implantation vacuum chamber. The construction of the vacuum chambers, the flanges for attachment of device 110 to the chambers, the seals, and the rotary feedthrough mechanism shown in FIG. 1 are beyond the scope of the present invention but are well known in the art.

Figure 2:
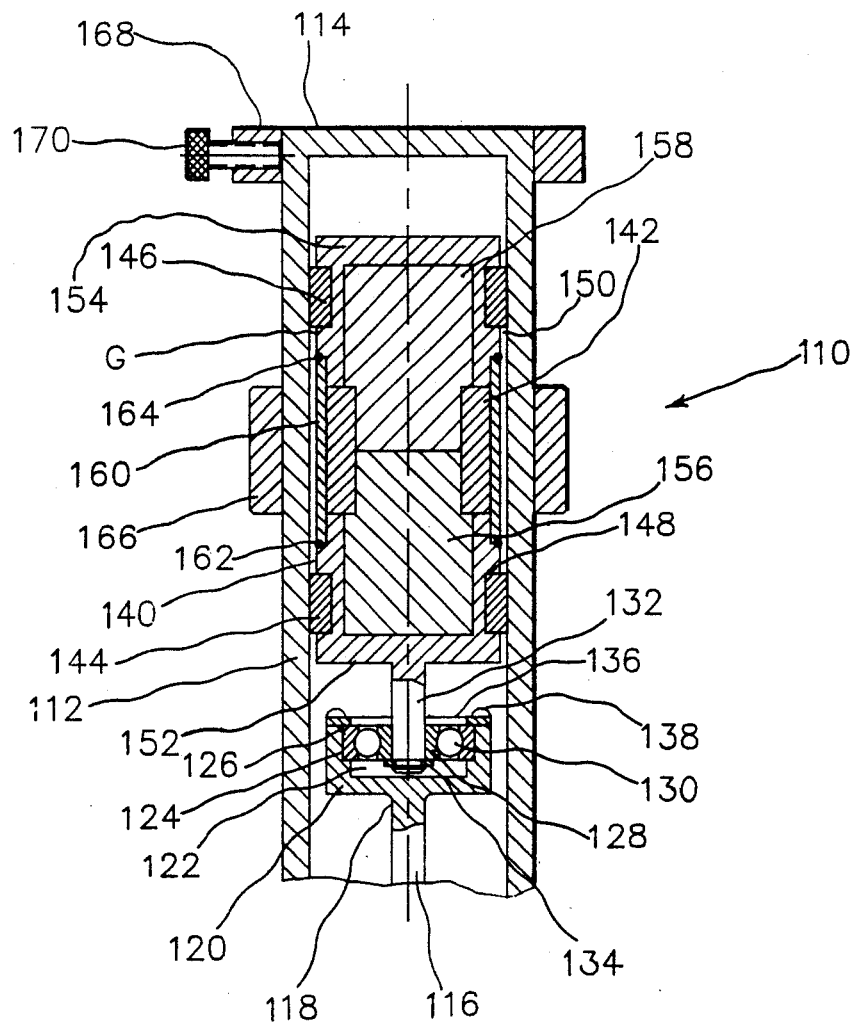
FIG. 2 is a fragmentary longitudinal sectional view of a device of the invention with improved construction of the inner magnet unit.

A shaft 116 shown in the lower part of FIG. 2 is the same as shaft 40 of the prior-art device of FIG. 1. Since the portion of device 110 missing in FIG. 1 is identical to the corresponding portion of FIG. 1, the following description will relate entirely to the elements of the sample transfer device improved by the present invention. It is worth mentioning, however, that shaft 116 rotates and at the same time can slide axially in the longitudinal direction of housing 112 for placing a sample into different positions within the sealed chamber or for moving it between the chambers.

A rear end 118 of shaft 116 has a cup-shaped bearing holder 120 whose diameter is larger than shaft 116. A recess 122 of holder 120 faces bottom 114 and receives a ball bearing 124 which has an outer race 126, inner race 128, and balls 130.

A drive shaft 132 is inserted into inner race 128 and projects slightly beyond (to the left of) inner race 128. A stop ring 134 is installed on the projecting portion of shaft 132. In order to fix shaft 132 against axial displacement with respect to cup-shaped bearing holder 120 and hence shaft 116, outer race 126 of ball bearing 124 is locked by a stop ring 136. Stop ring 136 can be attached to the front end of holder 120, for example, by screws 138.

Drive shaft 132 is rigidly connected to, or is made integrally with, a hollow cylindrical shell or casing 140 made from a vacuum-compatible material which can easily be penetrated by electromagnetic waves, but not by chemicals, including impurities and hazardous substances. A material suitable for these purposes is stainless steel. Sealed and clamped within hollow stainless-steel casing 140 is a ring-shaped inner magnet 142 made, for example, from a rare-earth sintered alloy, such as a porous cobalt-samarium alloy. The outer diameter of shell 140 is smaller than the inner diameter of housing 112, so that a gap G is formed between the outer surface of casing 140 and the inner surface of housing 112. Casing 140 is supported within housing 112 without play by slide rings 144 and 146 which are made from slow-friction and vacuum-compatible material such as PTFE, sold under the trademark TEFLON. Rings 144 and 146 are pressed or molded into annular grooves 148 and 150 on the outer surface of casing 140 and have a sliding fit inside housing 112. These rings serve to smoothly guide the casing and inner magnet 142 contained therein within housing 112.

In the embodiment illustrated in FIG. 2, casing 140 consists of two cup-shaped elements 152 and 154 which have their open ends facing each other. The space formed inside cup-shaped elements 152 and 154 is filled with cylindrical blocks 156 and 158. These blocks firmly fix inner magnet 142 in place. For reduction in weight, blocks 156 and 158 are made from aluminum or aluminum alloy. For ease of assembling, casing 140 has a central cylindrical portion 160 which covers inner magnet 142 and is welded at 162 and 164 by sealed seams for closing the casing after insertion of aluminum blocks 156, 158 and magnet 142 into the cavity formed by cup-shaped elements 152 and 154.

Slidingly installed on the outer surface of housing 112 is an annular outer permanent magnet 166 which is made from the same material as inner magnet 142 and also has a ring-shaped form. Both magnets are polarized so that their magnetic lines are radially directed, i.e., for each magnet, one pole is on its inner surface, and its opposite pole is on the outer surface. Both magnets are located at a close enough radial distance so that they have a magnetic interaction through the walls of housing 112 and gap G. In other words, inner permanent magnet 142 has a polarity opposite to that of outer permanent magnet 166 and is spaced radially from the outer magnet at a distance which is large enough to provide free movement of the inner magnet inside housing 112, but small enough so that magnetic force 142 from the outer magnet will be effectively coupled to the inner magnet. As a result, axial movements of outer magnet 166 will be transmitted through a magnetic attraction force to inner magnet 142 and hence to holder 120 on the end of shaft 116.

An extreme rear (righthand in FIG. 2) position of the outer magnet is limited by an adjustable stop 168 which can be fixed on housing 112, for example, by a bolt 170 in any axial position of cylindrical housing 112.

FIG. 2—OPERATION

In principle, sample transfer device 110 of the invention operates in the same manner as device 110 of FIG. 1, i.e., shaft 116 can be rotated and at the same time moved axially in the longitudinal direction of housing 112. Since the rotary motion mechanism shown in FIG.

1 is beyond the scope of the present invention, only movement in the axial direction will be considered.

Assume that shaft 116 is at a fully withdrawn position (not shown) so that magnets 142 and 166 are positioned near adjustable stop 168. In this position, the specimen holder and its specimen (not shown in FIG. 2) are located outside the vacuum chamber in which the specimen is to be treated. To move the specimen to the working position, an operator manually moves outer magnet 166 forward (to the left in FIG. 2). Magnetic force will pass from outer magnet 166 to inner magnet 142 via magnetically-permeable casing 140, causing inner magnet 142 to move together with the parts which are rigidly connected to the magnet. As a result, shaft 116 and the sample holder with the sample will move in the leftward direction. During this movement, sealed casing 140 is guided within housing 112 by slide rings 144 and 146.

Although the interior of housing 112 is under vacuum, the porous surface of inner magnet 142 is not exposed to the vacuum but is protected therefrom by sealed casing 140. Therefore, the pores of the sintered material of the magnet cannot absorb hazardous substances, or impurities, and cannot accumulate air which otherwise could delay evacuation of the vacuum chamber.

SYNOPSIS, RAMIFICATIONS, AND SCOPE

I have thus shown a sample transfer device which can move and transfer samples within and between sealed chambers, which uses an outer magnet located outside the housing of the device and an inner magnet located inside the housing. The surface of the inner magnet is protected from exposure to vacuum by a completely closed and sealed casing. Although this casing has been shown to have an assembled construction with parts made from stainless steel and connected by welding, it is understood by those skilled in the art that the inner magnet can be encapsulated by molding into a vacuum-compatible plastic or any other suitable vacuum-compatible and air-impermeable material. Means other than aluminum blocks, e.g., plastic blocks, can be use for holding the inner magnet inside the casing. The entire interior of the hollow casing can be filled with a moldable material which may hold the inner magnet rigidly. Housing 112 may alternatively have a square or hexagonal cross-section. Outer magnet 166 can be connected to a linear actuator controlled by a computer program. Other means than slide rings 144 and 146 can be used for guiding the casing inside the housing.

Therefore, the scope of the invention should be determined, not by the example given, but by appended claims and their legal equivalents.

I claim:

1. A sample transfer device for moving objects within a sealed chamber, comprising:
    a tubular housing closed at one end thereof and open at the other end thereof for attaching said housing to a sealed chamber;
    an elongated member located in said housing, said elongated member being moveable axially inside said housing, said elongated member having one end located near said closed end of said housing, and a second end being capable of protruding from said housing into said sealed chamber;
    a translatory motion unit having a drive member located outside said housing and moveable axially along said housing, and a driven member located inside said housing, said driven member being rigidly connected to said first end of said elongated member, said drive member of said translatory motion unit having contactless positive connection with said driven member, said driven member being located and fixed inside a sealed hollow body; and
    means for centering and guiding said hollow body in said housing.

2. The device of claim 1 wherein said drive and said driven members comprise an outer permanent magnet slidingly installed on the outer surface of said housing and an inner permanent magnet located inside said hollow body, said magnets being located at a distance large enough to provide free movement of said inner magnet inside said housing, but small enough to transmit magnetic force to said inner magnet from said outer magnet, said contactless positive connection between said drive member and said driven member comprising magnetic force; said housing and said hollow body being made from an air-tight and magnetically permeable material.

3. The device to claim 2 wherein said air-tight and magnetically permeable material is stainless steel.

4. The device of claim 3 wherein said magnets are made from a rare-earth metal alloy.

5. The device of claim 4 wherein said rare-earth metal alloy is a samarium-cobalt alloy.

6. The device of claim 1 wherein said hollow body has an outer diameter smaller than the inner diameter of said housing, said means for centering and guiding said hollow body comprises slide rings of a low-friction material which are attached to the outer surface of said hollow body and are in sliding contact with said inner surface of said housing, said drive member and said driven member comprising permanent magnets and said contactless positive connection is magnetic force.

7. The device of claim 1 wherein said sealed hollow body comprises:
    a first cup-shaped body connected to said one end of said shaft and having its open end facing said closed end of said housing;
    a second cup-shaped body having its open end facing said open end of said first cup-shaped body; and
    a central ring-shaped body located between open ends of said first and second cup-shaped bodies, so that when said first cup-shaped body, said second cup-shaped body, and said ring-shaped body are assembled, they form said sealed hollow body.

8. The device of claim 7 wherein said first cup-shaped member, said second cup-shaped member, and said central ring-shaped body are interconnected by sealed weld seams and are made from stainless steel.

9. The device of claim 7 wherein said driven member is fixed inside said hollow body by means of a filling body which fills the interior of said hollow body so that the position of said driven member is fixed inside said hollow body.

10. The device of claim 9 wherein said filling body comprises two blocks of a light material between which said driven member is squeezed.

11. The device of claim 10 wherein said blocks of said filling body are made from aluminum.

12. A sample transfer device for moving objects within and between sealed chambers, comprising:
    a tubular housing closed at one end thereof and open at the other end thereof for attaching said housing to a sealed chamber;

an elongated member located in said housing, said elongated member being moveable axially inside said housing, said elongated member having one end located near said closed end of said housing, and a second end being capable of protruding from said housing into said sealed chamber;

a translatory motion unit having a drive member in the form of an outer permanent magnet located outside said housing and moveable axially along said housing, and a driven member made in the for of an inner permanent magnet located inside said housing, said inner magnet being rigidly connected to said first end of said elongated member and having a polarity opposite to that of said outer permanent magnet, said inner magnet being installed inside said housing at a distance from said outer magnet large enough to provide free movement of said inner magnet inside said housing, but small enough to allow magnetic force to be coupled from said outer magnet, said contactless positive connection between said drive member and said driven member comprising magnetic force, said inner permanent magnet being located and fixed inside a sealed hollow body, said housing and said hollow body being made from an air-tight and magnetically-permeable material material; and means for centering and guiding said hollow body in said housing.

13. The device of claim 12 wherein said air-tight and magnetically permeable material is stainless steel.

14. The device of claim 12 wherein said hollow body has an outer diameter smaller than the inner diameter of said housing and said means for centering and guiding said hollow body comprises slide rings of a low-friction material which are attached to the outer surface of said hollow body and are in sliding contact with said inner surface of said housing.

15. The device of claim 12 wherein said sealed hollow body comprises:

a first cup-shaped body connected to said one end of said shaft and having its open end facing said closed end of said housing;

a second cup-shaped body having its open end facing said open end of said first cup-shaped body; and a central ring-shaped body located between open ends of said first and second cup-shaped bodies, so that when said first cup-shaped body, said second cup-shaped body, and said ring-shaped body are assembled, they form said sealed hollow body.

16. The device of claim 15 wherein said first cup-shaped member, said second cup-shaped member, and said central ring-shaped body are interconnected by sealed weld seams.

17. The device of claim 15 wherein said first cup-shaped member, said second cup-shaped member, and said central ring-shaped body are made from stainless steel.

18. The device of claim 15 wherein said inner magnet is fixed inside said hollow body by means of a filling body which fills the interior of said hollow body so that the position of said driven member is fixed inside said hollow body.

19. The device of claim 18 wherein said filling body comprises two blocks of a light material between which said driven member is squeezed.

20. The device of claim 9 wherein said blocks of said filling body are made from aluminum.

* * * * *

UNITED STATES PATENT AND TRADEMARK OFFICE
CERTIFICATE OF CORRECTION

PATENT NO. : 4,893,980
DATED : Jan. 16, 1990
INVENTOR(S) : Valentin Balter

It is certified that error appears in the above-identified patent and that said Letters Patent is hereby corrected as shown below:

Col. 7, line 10, change "for" to --form--.

Signed and Sealed this

Twenty-sixth Day of February, 1991

Attest:

HARRY F. MANBECK, JR.

*Attesting Officer*      *Commissioner of Patents and Trademarks*